United States Patent
Deverson et al.

(10) Patent No.: US 10,379,141 B2
(45) Date of Patent: Aug. 13, 2019

(54) METHOD AND APPARATUS FOR CLASSIFYING A SIGNAL WAVEFORM UNDER TEST

(71) Applicant: Fluke Precision Measurement Limited, Norwich (GB)

(72) Inventors: Peter Deverson, Almelo (NL); Floris Broekema, Enschede (NL)

(73) Assignee: Fluke Precision Measurement Limited, Norwich (GB)

( * ) Notice: Subject to any disclaimer, the term of this patent is extended or adjusted under 35 U.S.C. 154(b) by 296 days.

(21) Appl. No.: 15/157,228

(22) Filed: May 17, 2016

(65) Prior Publication Data

US 2016/0341766 A1 Nov. 24, 2016

(30) Foreign Application Priority Data

May 18, 2015 (EP) .................................. 15168015

(51) Int. Cl.
*G01R 13/02* (2006.01)

(52) U.S. Cl.
CPC ....... *G01R 13/029* (2013.01); *G01R 13/0254* (2013.01)

(58) Field of Classification Search
CPC combination set(s) only.
See application file for complete search history.

(56) References Cited

U.S. PATENT DOCUMENTS

| 5,092,343 A | * | 3/1992 | Spitzer | ................. A61B 5/0488 128/925 |
| 5,251,626 A | * | 10/1993 | Nickolls | ............. A61N 1/36514 128/925 |
| 6,571,185 B1 | | 5/2003 | Gauland et al. | |
| 6,621,913 B1 | | 9/2003 | De Vries | |
| 2008/0109041 A1 | * | 5/2008 | de Voir | .............. A61B 5/04017 607/7 |
| 2011/0060540 A1 | | 3/2011 | Bartlett et al. | |
| 2014/0160144 A1 | | 6/2014 | Martin et al. | |

OTHER PUBLICATIONS

Extended European Search Report for Application No. 15168015.4 dated Oct. 30, 2015, 5 pgs.

* cited by examiner

*Primary Examiner* — Mohamed Charioui
(74) *Attorney, Agent, or Firm* — Seed Intellectual Property Law Group LLP

(57) ABSTRACT

A method of classifying a signal waveform under test for appropriate numerical measurement includes acquiring waveform data indicative of the signal waveform under test, analyzing the waveform data, determining a signal waveform type from the analyzed waveform data, and activating an appropriate numerical measurement of the signal waveform under test based upon the determined signal waveform type. There is also provided a test and measurement instrument configured to carry out any of the disclosed methods.

16 Claims, 11 Drawing Sheets

| Repetitive Signal | Number of important bins | important bins | Test 1 | Test 2 | Test 3 | Test 4 | Test 5 | Test 6 | Test Signal | Signal Type | DC coupled measurement | AC coupled measurement |
|---|---|---|---|---|---|---|---|---|---|---|---|---|
| No | 0 | | bin 3 ≤ 0.2 | | | | | | | 1 | Vpp & Vdc | Vpp |
| | | | bin 3 > 0.2 | | | | | | | 2 | Vpp & Vdc | Vpp |
| | 1 | | no 5 | bin with ≤ 0.9 | | | | | | 1 | Vpp & Vdc | Vpc |
| | | | | bin with > 0.9 | | | | | | 2 | Vpp & Vdc | Vpc |
| | | | 5 | bin 5 > 0.5 | | | | | | 10 | Vdc & Vac | Vac |
| | | | | bin 5 ≤ 0.5 | | | | | | 10 | Vdc & Vac | Vac |
| | 2 | 1 and 2 | bin 1 + 2 ≤ 0.9 | | | | | | | 1 | Vpp & Vdc | Vpp |
| | | | bin 1 + 2 > 0.9 | | | | | | | 10 | Vdc & Vac | Vac |
| | | 1 and 3 | bin 3 ≤ 0.65 | | | | | | | 2 | Vpp & Vdc | Vpp |
| | | | bin 3 > 0.65 | | | | | | | 10 | Vdc & Vac | Vac |
| | | 1 and 4 | bin 3 ≤ 0.1 | | | | | | | 1 | Vpp & Vdc | Vpp |
| | | | bin 3 > 0.1 | | | | | | | 1 | Vpp & Vdc | Vpp |
| | | 1 and 5 | bin 2 + 3 ≤ 0.9 | | | | | | | 2 | Vpp & Vdc | Vpc |
| | | | bin 2 + 3 > 0.9 | | | | | | | 10 | Vdc & Vac | Vac |
| | | 2 and 3 | bin 3 + 4 ≤ 0.9 | | | | | | | 2 | Vpp & Vdc | Vpp |
| | | | bin 3 + 4 > 0.9 | | | | | | | 10 | Vdc & Vac | Vac |
| | | 3 and 4 | bin 1 ≤ 0.65 | | | | | | | 2 | Vpp & Vdc | Vpp |
| | | | bin 3 > 0.65 | | | | | | | 10 | Vdc & Vac | Vac |
| | | 3 and 5 | | | | | | | | 10 | Vdc & Vac | Vac |
| | | 4 and 5 other combination | | | | | | | | 10 | Vpp & Vdc | Vpp |
| | 3 | 1,3 and 5 | bin 3 ≤ 0.65 | | | | | | | 10 | Vdc & Vac | Vac |
| | | | bin 3 > 0.65 | | | | | | | 2 | Vpp & Vdc | Vpp |
| | | 1,2 and 5 | | | | | | | | 1 | Vpp & Vdc | Vpp |
| | | 1,4 and 5 | | | | | | | | 1 | Vpp & Vdc | Vpc |
| | | other combination | | | | | | | | 10 | Vdc & Vac | Vac |

| Repetitive Signal | Number of important bins | Important bins | Test 1 | Test 2 | Test 3 | Test 4 | Test 5 | Test 6 | Test Signal | Signal Type | DC coupled measurement | AC coupled measurement |
|---|---|---|---|---|---|---|---|---|---|---|---|---|
| Yes | 2 | 1 and 2 | bin 4 > 0.01 | bin 1 > 0.35 | | | | | | 3 | Vac+dc & Hz | Vac & Hz |
| | | 1 and 2 | bin 4 ≤ 0.01 | bin 1 ≤ 0.35 | | | | | | 7 | Vpp & Hz | Vpp & Hz |
| | | 1 and 2 | | |bin 1 + 2 -0.5| ≤ 0.06 | | | | | | 9 | Vpp & Hz | Vpp & Hz |
| | | 1 and 5 | bin 3 = 0 | | activity > 25 | | | | | 6 | Vpwm & Hz | Vpwm & Hz |
| | | 1 and 5 | bin 3 = 0 | |bin 1 + 2 -0.5| > 0.06 | activity ≤ 25 | | | | | 4 | Vpp & Hz | Vpp & Hz |
| | | 1 and 5 | bin 3 > 0 | bin 2,3 and 4 > 0.1 | | | | | | 4 | Vpp & Hz | Vpp & Hz |
| | | 1 and 5 | bin 3 > 0 | bin 2,3 and 4 ≤ 0.1 | | | | | | 3 | Vac+dc & Hz | Vac & Hz |
| | | 2 and 3 | bin 1 ≤ 0.07 | bin 5 > 0.01 | | | | | | 4 | Vpp & Hz | Vpp & Hz |
| | | 2 and 3 | bin 1 ≤ 0.07 | bin 5 ≤ 0.01 | | | | | | 5 | Vpp & Hz | Vpp & Hz |
| | | 2 and 3 | bin 1 > 0.07 | | | | | | | 9 | Vpp & Hz | Vpp & Hz |
| | | 3 and 4 | bin 1 > 0.07 | | | | | | | 8 | Vpp & Hz | Vpp & Hz |
| | | 1 and 3 | | | | | | | | 8 | Vpp & Hz | Vpp & Hz |
| | | 1 and 4 | | | | | | | | 6 | Vpwm & Hz | Vpwm & Hz |
| | | 2 and 5 | activity ≤ 30 | | | | | | | 6 | Vpwm & Hz | Vpwm & Hz |
| | | 2 and 5 | activity > 30 | | | | | | | 6 | Vpwm & Hz | Vpwm & Hz |
| | | 3 and 5 | | | | | | | | 4 | Vpp & Hz | Vpp & Hz |
| | | 4 and 5 | | | | | | | | 6 | Vpwm & Hz | Vpwm & Hz |
| | 3 | 1,3,5 | | | | | | | | 3 | Vac+dc & Hz | Vac & Hz |
| | | 1,2,3 | | | | | | | | 6 | Vpwm & Hz | Vpwm & Hz |
| | | 1,2,5 | activity ≤ 30 | | | | | | | 7 | Vpp & Hz | Vpp & Hz |
| | | 1,2,5 | activity > 30 | | | | | | | 4 | Vpp & Hz | Vpp & Hz |
| | | 1,4,5 | activity > 30 | | | | | | | 6 | Vpwm & Hz | Vpwm & Hz |
| | | 1,4,5 | activity ≤ 30 | | | | | | | 4 | Vpp & Hz | Vpp & Hz |
| | | 3,4,5 | | | | | | | | 5 | Vpp & Hz | Vpp & Hz |
| | | 2,3,4 | | | | | | | | 8 | Vpp & Hz | Vpp & Hz |

Fig.12c

METHOD AND APPARATUS FOR CLASSIFYING A SIGNAL WAVEFORM UNDER TEST

BACKGROUND

Technical Field

This present disclosure relates to a method and apparatus for classifying a signal, and, in particular, to a method and apparatus for classifying a signal waveform under test, e.g., for appropriate numerical measurement by a test and measurement instrument.

Description of the Related Art

This present disclosure relates generally to the automatic selection and measurement of the most appropriate numeric parameters of a signal waveform when using a test and measurement instrument, such as an oscilloscope.

An oscilloscope displays the waveform of a signal, but users typically require numerical measurements of the signal, for example the frequency, peak to peak voltage, Root Mean Square (R.M.S.) voltage or other numeric parameter (s) to be measured in conjunction with the display of the signal waveform.

For conventional oscilloscopes, the selection of the most appropriate numerical parameter(s) or measurement(s) requires user identification of the signal waveform, and then manual selection to activate the appropriate numeric parameter(s)/measurement(s).

Accordingly, it would be desirable to have an automated method and apparatus to select appropriate numerical parameters and measurements in a test and measurement instrument.

This reduces the thought process involved and amount of manual operation of the test instrument required by the user, making it faster and simpler in use, even by less experienced personnel.

It is an object of certain embodiments of the present disclosure to overcome at least some disadvantages associated with the prior art.

BRIEF SUMMARY

The present invention provides a method of classifying a signal waveform under test as described in the accompanying claims.

Specific embodiments of the invention are set forth in the dependent claims.

These and other aspects of the invention will be apparent from and elucidated with reference to the embodiments described hereinafter.

Examples in this disclosure analyze the input signal, determine the signal form (irrespective of frequency or amplitude), and then automatically select the most appropriate numerical parameters(s)/measurement(s) for that signal waveform. The below described specific examples relate to common electrical signals; however the basic concept may be customized to distinguish other specific signals if required.

BRIEF DESCRIPTION OF THE SEVERAL VIEWS OF THE DRAWINGS

Embodiments of the disclosure are further described hereinafter with reference to the accompanying drawings, in which:

FIGS. 12a to 12c shows a decision tree for deciding what sort of signal is being input into a test and measurement instrument according to example embodiments. These figures are a single table spread over multiple pages, for legibility.

DETAILED DESCRIPTION

Embodiments of the present disclosure provide a method and apparatus for classifying a waveform type of a signal under test, which may be used in a test and measurement instrument, such as a digital oscilloscope or the like. In some embodiments, the test and measurement instrument may be a handheld test and measurement device. Examples may numerically characterize and then classify any input signal waveform so that appropriate numerical measurements can be automatically selected by the test and measurement instrument. For example, if the unknown input signal waveform is a sine wave, the most appropriate numerical measurements may be Volts rms and Frequency. Examples can be expanded or optimized for any input signal waveform type by suitable adjustment of test values, templates, and the like, or the addition of further specific tests.

There will now follow a description of a specific example in the form of a digital oscilloscope, however, it will be appreciated that examples may be embodied in any suitable test and measurement instrument.

Figure 1:
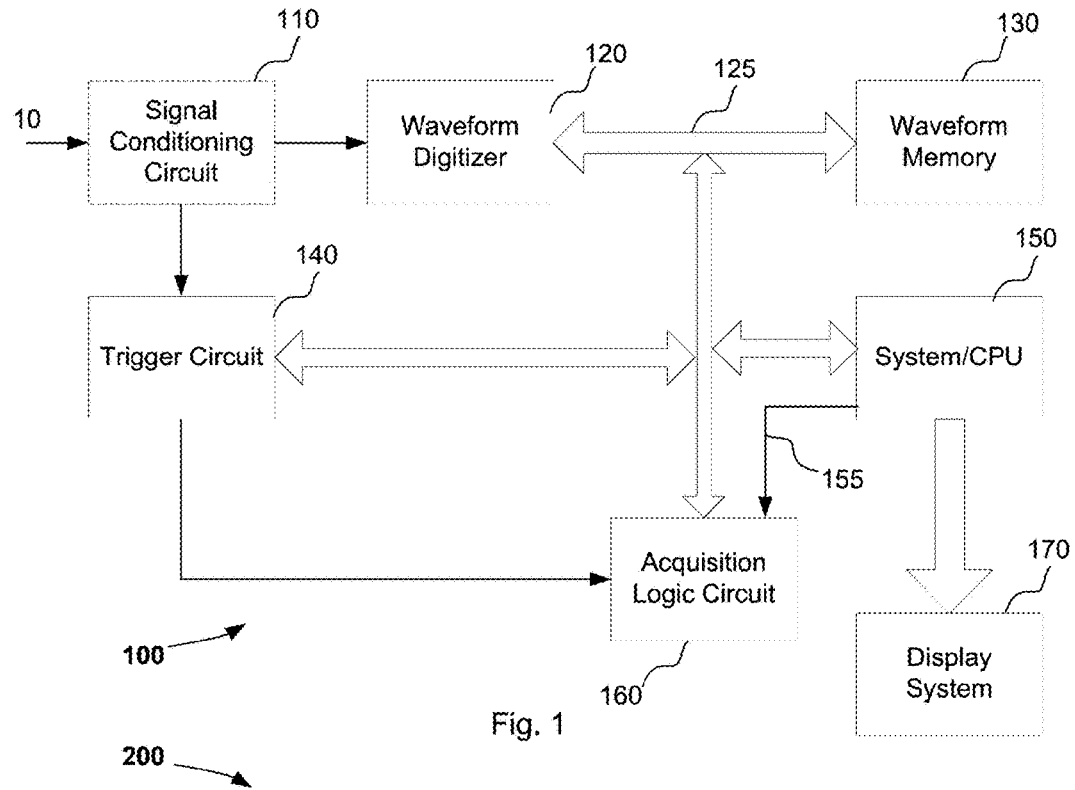
FIG. 1 shows a generalized block diagram of a digital oscilloscope having signal waveform classification capability in accordance with an example embodiment.

Referring to FIG. 1 of the drawings, there is shown a generalized block diagram of a digital oscilloscope 100 having signal waveform classification capability in accordance with an example of the present invention. The digital oscilloscope 100 may also have trigger recognition capabilities, such as automatic triggering to adjust the amplitude and/or timebase of a received input signal, so that at least one complete cycle of a repetitive input signal is captured for subsequent signal type classification, as described herein. A suitable example of automatic triggering is disclosed in U.S. Pat. No. 6,621,913, which is hereby incorporated by reference in its entirety.

Returning to FIG. 1, input analog signals, for example carrying the signal waveform to be classified, are applied via an input terminal 10 to an optional signal conditioning circuit 110, which may suitably include conventional input coupling, attenuators, and preamplifiers to condition the input signal 10 to suitable levels for further processing by a waveform digitizer 120. Waveform digitizer 120 may suitably include a conventional analog-to-digital converter which samples and converts instantaneous points along the waveform of the input signal to digitize data at a rate determined by an internal sampling clock. The stream of digital data thus produced is stored in a waveform memory 130, as a plurality of digital samples, under control of an acquisition logic circuit 160, which may include a microprocessor or the like in conjunction with digital signal processing circuits to provide waveform acquisition logic in the conventional manner, as well as provide signal waveform classification in accordance with the present invention. The example digital oscilloscope 100 also includes a bus 125 for transmitting and receiving data between the various portions of the overall test and measurement instrument circuitry. The oscilloscope may also include a system CPU 150 coupled to the bus 125 and a display system, so that an output waveform and associated waveform parameter data may be displayed to a user. The system CPU 150 may optionally adjust the display as a result of the described waveform classification methods.

The input analog signal (i.e., the signal under test) may be picked off from the signal conditioning circuit 110 and applied to one input of a raw-trigger circuit 140. Raw-trigger circuit 140 compares the input analog signal with level information provided by the acquisition logic circuit 160, and generates suitable raw trigger signals, for example upon the occurrence of level-crossing events. The raw trigger signals are applied to the acquisition logic circuit 160, where such raw trigger signals are further processed in accordance with certain embodiments to issue valid trigger signals to halt waveform acquisition and freeze the contents of waveform memory 130. Thereafter, the waveform information stored in waveform memory 130 may be processed and sent to a display system 170 having a display screen to display waveforms in, for example, a conventional amplitude-versus-time format.

By using a test and measurement instrument having suitable triggering capabilities, for repetitive input signals this results in at least one complete cycle of the input signal being stored in the waveform memory 130 (e.g., in a waveform data record, which may be a plurality of digital samples in the waveform memory 130), together with the expected time window of the next trigger (which may be approximately the determined repetition rate of the input signal). For non-repetitive signals, no time window of the next trigger may be identified, and the digital memory 130 may for example simply fill up a waveform data record with digital samples up to the (allocated, or available) memory size limit for a single measurement waveform data record.

The presence of a time window data entry for the next trigger in the waveform memory 130 may serve as an indication that the signal under test/being measured is repetitive, whilst no time window data entry may indicate the signal is non-repetitive.

An exact repetition rate (or frequency) of the signal may then be measured, for example using the frequency counter function of the oscilloscope 100. The frequency counter function measures the time between triggers that fall within the defined time window (i.e., the single cycle time for repetitive signals). In the case of repetitive signals, this gives a result for the frequency, but in the case of non-repetitive signals where no time window can be defined, no measurement of the frequency can be made. The result of the above actions yields a waveform memory 130 portion that contains either at least one complete cycle of a repetitive signal, or is full with non-repetitive data (e.g., of a random stream type input signal) up to a predetermined memory size limit; a flag for repetitive or non-repetitive signal type; and, for repetitive signals, an accurate measurement of the repetition frequency.

Figure 2:
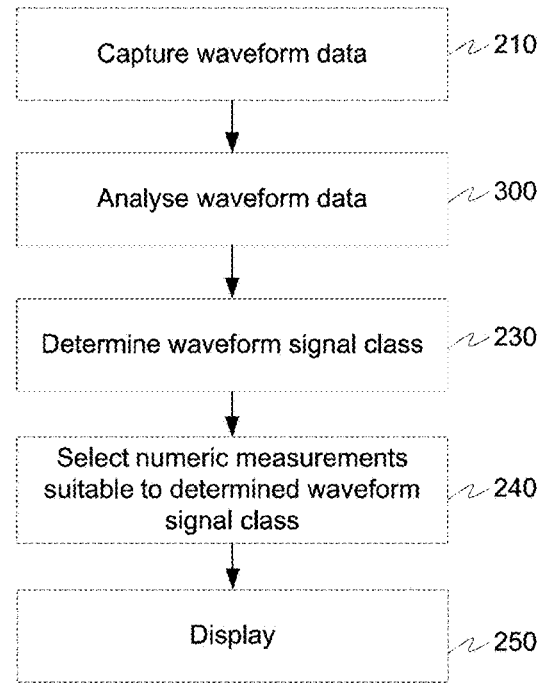
FIG. 2 shows a high level flow diagram of the method of classifying a signal in accordance with an example embodiment.

FIG. 2 illustrates a method 200 of classifying a signal waveform under test according to an example. The method 200 may be performed by a test and measurement instrument apparatus, such as digital oscilloscope 100 as illustrated in FIG. 1.

The method comprises an optional first stage of capturing (acquiring) waveform data for the signal waveform under test 210. The capturing step may be optional in some examples, because the signal classification may be carried out by an entity different than the one that actually captured the input signals. For example, captured data may be acquired remotely and transmitted to the system carrying out the disclosed classification methods.

The classification method 200 further includes analysis of the (captured or otherwise acquired) waveform data 300, which will be described in more detail with reference to FIG. 3 below. After the waveform analysis 300 is complete, the type of input signal waveform (e.g., its signal class) can be determined 230, and the determination may optionally be used to select 240 suitable (potentially further) numerical measurements to carry out on the input signal dependent on the signal type classification result and/or optionally further include displaying 250 the input signal to a user. The method may also further include (but not shown in the figure) adjusting the display of the input signal on the test and measurement display (or adjusting some other function of the test and measurement instrument) based upon the signal type classification result.

Figure 3:
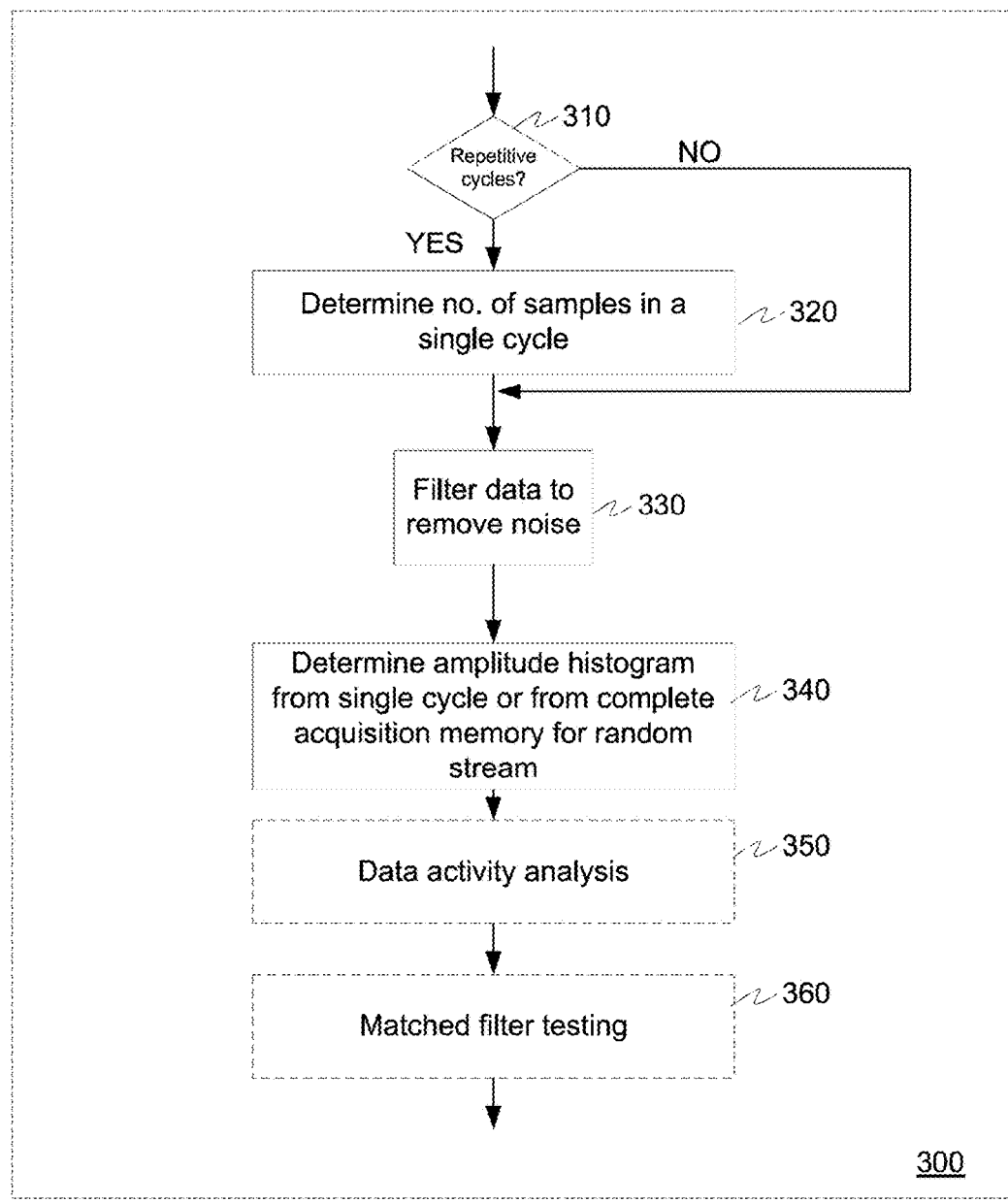
FIG. 3 shows a more detailed flow diagram of the waveform analysis portion of the method of classifying a signal in accordance with an example embodiment.

FIG. 3 illustrates the data analysis portion 300 of the method 200 of classifying a signal waveform under test according to an example.

The data analysis portion 300 includes a first step to determine if the captured input signal comprises repetitive cycles 310 (i.e., is a waveform of a repetitive signal). This may be done, for example, by checking for the (or status of) flag for repetitive or non-repetitive signal type.

If the method finds there are repetitive cycles, the method proceeds to determine a number of samples in a single cycle of the captured input signal 320.

Figure 4:
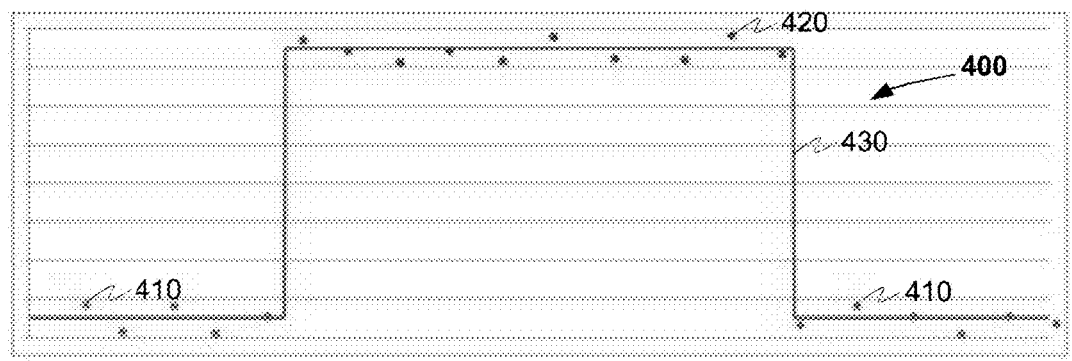
FIG. 4 shows an example of a noise filtering process acting on a square wave signal under test.

Next, the method includes a filtering step 330, which filters the captured data to remove unwanted noise, as described in more detail below with reference to FIG. 4.

At 340, the method proceeds with a step to determine the amplitude histogram for a single cycle of a repetitive signal under test, or for the entire waveform data record in the waveform memory 130 in the case of a non-repetitive signal under test, both of which are described in more detail below, with reference to FIGS. 7 and 8.

At 350, the method includes a data activity analysis step which is described in more detail below.

At 360, the method further includes a matched filter testing step which is described in more detail below, with reference to FIGS. 5 and 6.

Noise Reduction Filters

To improve the quality of the signal, and remove random noise which may influence later calculations, the measured waveform may be filtered at step 330 noted above. For example, a moving average filter with edge detection (may also be called step detection) may be used. Other filter types may equally be used, in alternative embodiments.

This moving average with edge detection filter is much the same as a moving average filter, but additionally takes amplitude jumps or drops into account. This way, the edges remain unchanged, while the noise is filtered away by taking the average of surrounding samples. This should preserve the shape of the waveform (e.g., square wave), which is not always the case when using a normal moving average filter. An example of such a filter 400 is shown in FIG. 4, in which an input sampled square wave signal is shown (all of sample points 410 and 420, as a whole), together with the determined sample approximation 430. In more detail, there is displayed the noisy samples for the 'low' signal state 410, and the 'high' signal state 420, which are amplitude averaged for each set (i.e., all the 'low' values are averaged together, and separately from all the 'high' values that are averaged together). This way, the vertical line in the square signal will be preserved, resulting in an output averaged waveform 430, having reduced random noise compared to the original samples.

In more detail, let $x_i$=1, 2, 3, . . . be the digital samples of the signal under test, and let the n previous and the n subsequent samples be used in the noise reduction filter. Then an edge detection parameter $\alpha$ can be defined to decide if a change in amplitude is big enough to be not noise (i.e., the amplitude difference is sufficiently large enough to be considered a signal state change rather than simply random noise). Then a formula for the edge detection filter can be made with a simple restraint and may be described by equation (1) below:

$$\hat{x}i = \sum_{j \in A} xj, \quad (1)$$
$$A = \{k \mid |k - i| \leq n, |x_k - k_{k \pm 1}| \leq \alpha * \text{total amplitude}\}$$

The parameter $\alpha$ should be chosen to be a suitable value for the particular implementation desired, and may be found empirically. For example, it may be considered appropriate that the shape of the waveform must not be changed too much, but the noise should be reduced, therefore a choice of 20% step change should be observed before the change is considered beyond noise. Put another way, this means the filter operates so that samples with a difference of more than 20% of the total amplitude will not be used in the filter.

In some examples, the noise filter may be implemented as five steps. For example, let x(i), i=1, 2, 3, . . . be the samples, let the filter use 5 previous and 5 subsequent samples (i.e., n=5) and choose the edge detection parameter $\alpha$=0.2.

In a first step, calculate, for each sample, the difference between the current and next sample, described by equation (2) below:

$$\text{difference}(i) = |x(i) - x(i+1)| \quad (2)$$

In a second step, calculate the total amplitude by subtracting the minimum value from the maximum value, described by equation (3) below:

$$\text{total amplitude} = \text{maximum(waveform)} - \text{minimum(waveform)} \quad (3)$$

In a third step, check, for each sample, if the difference is bigger than the edge detection parameter. Express this as c and if it is bigger, give it value 0 and if it is smaller or equal give it value 1, described by equation (4) below:

$$c(i) = \begin{cases} 1 & \text{if difference}(i) \leq 0.2 * \text{total amplitude}; \\ 0 & \text{if difference}(i) > 0.2 * \text{total amplitude} \end{cases} \quad (4)$$

In a fourth step, compute the number of samples used in the filter for each sample. Samples may only be used if an adjacent sample closer to the considered sample is used as well. To check this, multiply by the previous edge detection parameters. For example, let sample x(i+1) be very different from x(i), but let x(i+2) be close to x(i). Then c(i)=0 and c(i+1)=1, but for sample i+2, it holds that c(i)*c(i+1)=0. So the sample i+2 is not used, because sample i+1 is not used while it is closer to i, described by equation (5) below:

$$\text{samples} = 1 + \sum_{j=1}^{5} \left( \prod_{k=1}^{j} c(i+k-1) + \prod_{k=1}^{j} c(i-k) \right) = \quad (5)$$

$$1 + c(i) * (c(i+1) * (c(i+2) * (c(i+3) * (c(i+4) + 1) + 1) + 1) + 1) +$$
$$c(i-1) * (c(i-2) * (c(i-3) * (c(i-4) * (c(i-5) + 1) + 1) + 1) + 1)$$

A fifth step, which is the actual filter step that makes the new samples $\hat{x}(i)$. For each sample, calculate the average of the samples which have edge detection parameters equal to 1. Again the adjacent sample closer to the considered sample should also have a 1. This results in the same equation as in step 3, but instead of 1's, it uses the values of the corresponding samples. Besides, the result should be divided by the number of samples used as calculated in step 3.

$$\bar{x}(i) = \left( x(i) + \sum_{j=1}^{5} \left( x(i+j) * \prod_{k=1}^{j} c(i+k-1) + x(i-j) * \prod_{k=1}^{j} c(i-k) \right) \right) / \quad (6)$$

$$\text{samples} = x(i) +$$
$$c(i) * (c(i+1) * (c(i+2) * (c(i+3) * (c(i+4) * x(i+5) + x(i+4)) +$$
$$x(i+3)) + x(i+2)) + x(i+1)) + c(i-1) *$$
$$(c(i-2) * (c(i-3) * (c(i-4) * (c(i-5) * x(i-5) + x(i-4)) +$$
$$x(i-3)) + x(i-2)) + x(i-1)) / \text{samples}$$

In some example implementations, the process may be carried out in more or less steps. For example, the forward and backward differences and edge detection parameters may be calculated independently. Also note that the first and last samples of any given acquisition of a signal under test will not have the five previous or subsequent samples, which should be taken into account during processing of the respective point in the signal.

Activity Measurement

The optional data activity analysis 350 (i.e., activity measurement) will now be explained, which is a sub-process that rates the activity of a waveform (of the signal under test). Note that the activity measurement provided by data activity analysis 350 may not always have to be used, since the signal under test may be classifiable without this step. That is, it is an additional sub-step that may be used to separate a few particular signal types, and so should only be used when it is actually needed.

The data activity analysis 350 step acts to count the number of times a sample-to-sample amplitude difference exceeds a percentage of the signal peak-to-peak amplitude. This gives an indication of the dynamic behavior of the signal under test, which may be useful in classifying some signals. For example, a pure sine wave has limited dynamics, yet a pulse width modulated signal (equivalent to a sine wave, in some ways) may have significant dynamics. An example activity limit may be chosen to be 30% of the total amplitude. In such an example, the filter can be explained in four simple steps:

A first step in which the total amplitude is calculated, described by equation (7) below:

$$\text{Peak to peak amplitude} = \text{maximum(waveform)} - \text{minimum(waveform)} \tag{7}$$

A second step, where, for all samples, the difference between the current and next sample is calculated, described by equation (9) below:

$$\text{difference} = x(i) - x(i+1) \tag{9}$$

A third step in which a check is carried out for each step determined to have activity (i.e., it was determined there was activity present). This may be done for example by checking if the difference exceeds the activity restriction. If it does exceed the activity restriction, then a value 1 may be given, else give it a value 0, described by equation (10) below:

$$\text{activity}(i) = \begin{cases} 1 & \text{if difference}(i) \leq 0.3 * \text{total amplitude} \\ 0 & \text{if difference}(i) > 0.3 * \text{total amplitude} \end{cases} \tag{10}$$

A fourth step that sums the activity for the total activity for a whole waveform, described by equation (11) below:

$$\text{total activity} = \Sigma_i \text{activity}(i)$$

Matched Filter

The optional matched filter testing 360 will now be described which compares a (captured/acquired) waveform of a signal under test to a template to see how similar they are.

In some examples, the matched filter may compare one period of a measured signal to a template (but other examples, not shown, may compare more than one period). This is done with help of the following equation (12):

$$\text{matched filter} = \frac{x \cdot u^T}{\|x\| \|u\|} \tag{12}$$

In equation (12) above, x is a vector of the measured samples, u is the template vector, in the numerator the inner product is used, $u^T$ is the transpose of u and the 2-norm is used in the denominator. Because the denominator is always bigger than the numerator, the value of this matched filter is smaller or equal 1. When the measured samples are close to the values of the template, the value of the filter is close to 1. Whereas, when the samples are the negative version of the template, the value is −1. So values close to 1 or −1 represent match similarities.

The matched filter is invariant of scalar multiplication. This means that the amplitude does not matter. However, amplitude offset does matter, so the amplitude offset of the template being compared against should be made the same as the amplitude offset of the signal under test (which can be done by suitable pre-correction).

The matched filter may be implemented in a form including data storage memory arranged to store a template for each signal type desired to be matched against, for use (only) where the other steps in the method do not already provide a classification of the respective input signal type. For example, it may be applied for positive and negative ramps and triangle waveform (see FIGS. 5 and 6). Where matched filters are used, the templates stored should have a similar number of data points as would be typically captured by the test and measurement instrument in which the method is embodied. For example, if the test and measurement instrument measures 2 to 6 periods of a signal with 2000 samples, a template should then consist of at least 1000 data points to make a good comparison. Put another way, the template size and resolution should match the data capture capabilities of the test and measurement instrument carrying out examples of the invention.

Figures 5, 6:
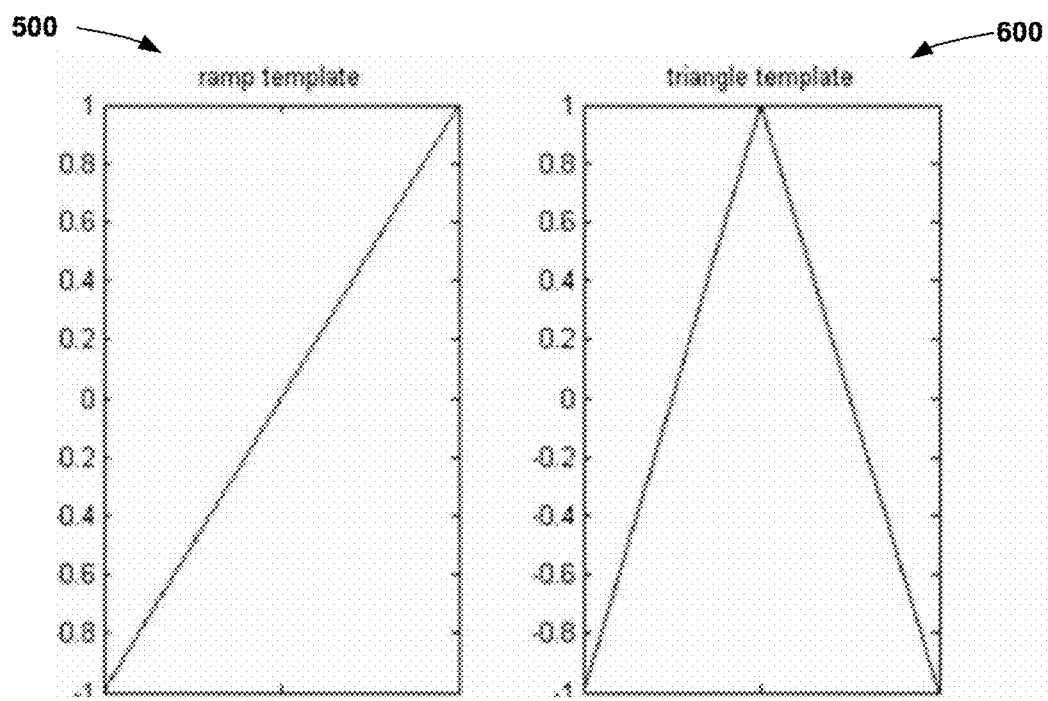
FIG. 5 shows a first example matched filter type for matched filter testing in accordance with an example embodiment.
FIG. 6 shows a second example matched filter type for matched filter testing in accordance with an example embodiment.

FIG. 5 shows an example template for a ramp signal classification that has 1000 data points and is described by formula (13) below:

$$y = -1 + \frac{2}{1000} x \tag{13}$$

This is a diagonal line from −1 to 1 with an average value of 0.

FIG. 6 shows an example template used for the triangle signal classification and is described by equation (14) below:

$$y = 1 - 4/1000 |x - 500| \tag{14}$$

In some examples, the matched filter analysis may be implemented in nine steps (but other numbers of steps may equally be used, depending on implementation specifics). Let x(i), i=1, 2, 3 . . . be the samples which are measured and u(i) be the elements of the template:

A first step that measures the frequency of the repetitive signal, if applicable, to provide a single period length.

A second step that calculates number of samples per period, and then rounds this down. It is therefore now known what are the sample interval and the frequency. The sample interval is the time between two consecutive/contiguous samples. 'Floor' is the function/command to round a number down, as used in the equation (15) below:

$$\text{Samples per cycle} = \text{Floor}\left(\frac{1}{\frac{\text{frequency}}{\text{sample interval}}}\right) \tag{15}$$

A third step that finds the sample with the minimum value in the first M samples (not the value itself), for example M may be 1000 for the examples shown in FIGS. 5 and 6. The minimum value of a vector can be found with the function min(x). Then, the sample with this value may be found, for example by checking each sample to see if it is equal to this minimum value, as described by equation (16) below:

$$\text{if } x(i)=\min(x) \Rightarrow \text{minimal sample is sample } i \quad (16)$$

A fourth step that now selects all the samples of one period starting with the minimal sample which was found in step 3. This may be done for example by selecting the samples x(i) to x(i+samples per cycle−1). Now a whole cycle of samples is selected, call it x.

A fifth step to calculate the average value of this cycle, x, as described by equation (17) below:

$$\text{sample\_average} = \frac{1}{\text{samples per cycle}} * \sum_i x(i) \quad (17)$$

A sixth step that subtracts this sample average value from each of the samples in set A. The new samples therefore become, as described by equation (18) below:

$$X(i)=x(i)-\text{sample\_average} \quad (18)$$

A seventh step to select a portion of the elements of the template of the same size as one cycle. For example, this may be the middle elements of the template, so in a template that has 1000 elements, it may mean to select the $500^{th}$ element and surrounding samples as many as the samples per cycle. The order of the elements may be as in the original template. This selection, call it u, of elements is the template that will be used for the matched filter.

An eight step to remove the average value of the template u calculated above, as described by equation (19) below:

$$u(i) = (u)i - \frac{1}{\text{samples per cycle}} * \Sigma_i u(i) \quad (19)$$

A ninth step that computes the value of the matched filter. For example, this may be done by dividing the inner product of the template and the samples by the product of the 2-norms of the samples and template, as described by equation (20) below:

$$\frac{x * u^T}{\|x\|\|u\|} = \frac{\Sigma_{i=1} x(i) * u(i)}{\sqrt{\Sigma_i x(i)^2} \sqrt{\Sigma_i u(i)^2}} \quad (20)$$

In some examples, other numbers of steps may be used instead. When using these steps, one measured cycle may be used and compared to a piece of the template with the same size. Moreover, the template and measured cycle may have their average removed such that the amplitude offset is the same.

Amplitude Histogram and Importance Weighting

The amplitude histogram stage may be used to split the samples based on their relative value in different portions (i.e., bins). This is useful because the absolute amplitude does not matter nor does the signal frequency. The amplitude histogram is easy to make and can be described in four steps:

In a first step, calculate the minimum and maximum amplitude in one cycle of the measured repetitive signal (OR calculate the minimum and maximum amplitude in the complete acquisition length for a non-repetitive signal). The cycle length may be determined by measuring the frequency of triggers which may be generated for example by the method described in U.S. Pat. No. 6,621,913 B1, as discussed above. The number of samples over which the histogram will be calculated may be determined as follows in equation (21):

$$\text{samples per cycle} = \text{floor}\left(\frac{1}{\frac{\text{frequency}}{\text{sample interval}}}\right) \quad (21)$$

In a second step, example embodiments divide the amplitude between the minimum and maximum value into five equal horizontal parts (i.e., bins) and number these parts from bottom to top from 1 to 5, i.e., create five histogram bins into which each sample is placed. Example embodiments may use five bins because this provides enough resolution for analysis while limiting the amount of processing, but also, on noisy signals (even after filtering), more than five bins may not be useful (e.g., because minimal actual additional information is realized by increasing the number of bins, and only actually increases the data processing load without enabling improved signal characterization—i.e., the forest and the trees syndrome). However, other numbers of bins may be used instead of five, in some alternative example embodiments.

In a third step, the number of samples which have a value that falls into each of bins 1 to 5 are counted in turn—i.e., the samples are binned into the respective bins 1 to 5. Do this for all samples and all bins.

In a fourth step, the result of the binning process is a histogram.

Figure 7:
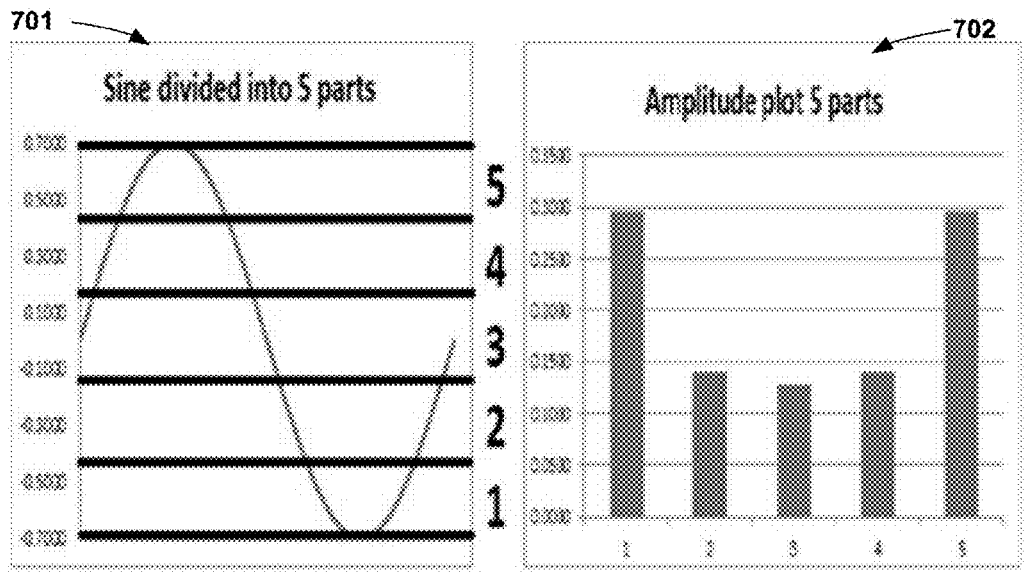
FIG. 7 shows a first example of a signal under test waveform, in the form of a sine wave, and how this signal under test waveform can be histogram binned in accordance with an example embodiment.

FIG. 7 shows a first example of a signal under test waveform, in the form of a sine wave 701, and how this signal under test waveform can be histogram binned 702 in accordance with an example embodiment.

Figure 8:
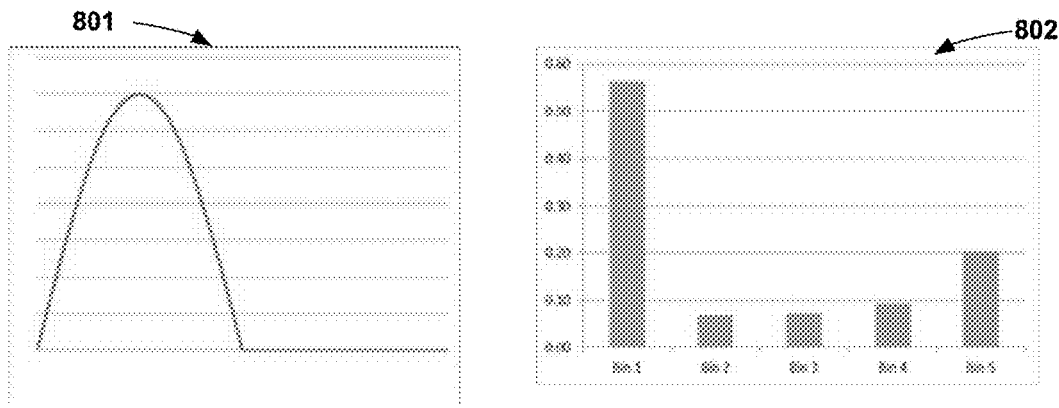
FIG. 8 shows a second example of a signal under test waveform, in the form of a half wave rectified sine wave, and how this signal under test waveform can be histogram binned in accordance with an example embodiment.

FIG. 8 shows a second example of a signal under test waveform, in the form of a half wave rectified sine wave 801, and how this signal under test waveform can be histogram binned 802 in accordance with an example embodiment.

Figure 9:
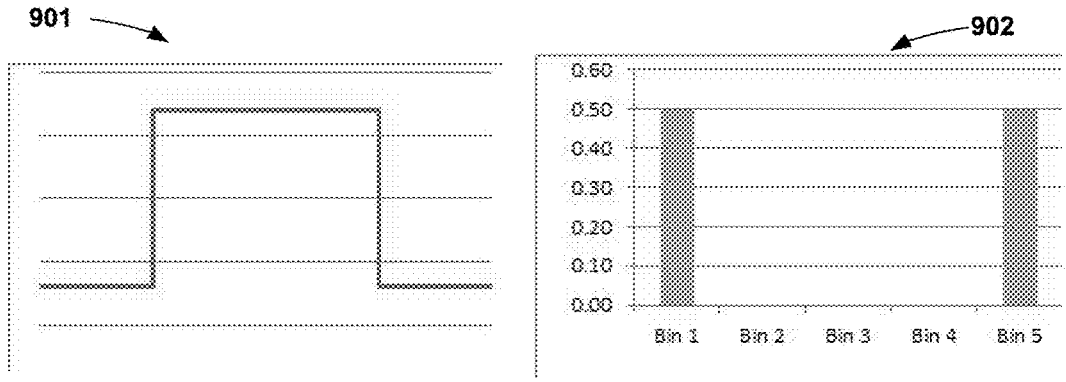
FIG. 9 shows a third example of a signal under test waveform, in the form of a pure square wave, and how this signal under test waveform can be histogram binned in accordance with an example embodiment.

FIG. 9 shows a third example of a signal under test waveform, in the form of a pure square wave 901, and how this signal under test waveform can be histogram binned 902 in accordance with an example embodiment.

Figure 10:
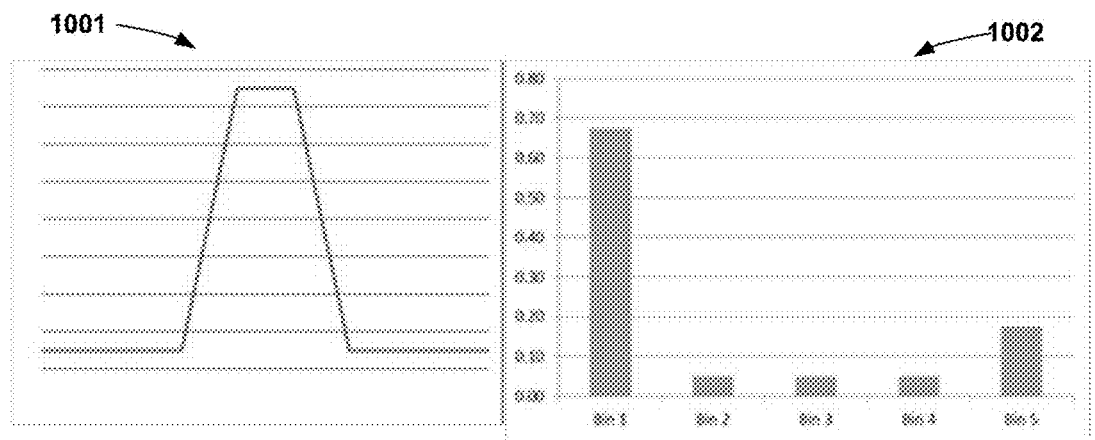
FIG. 10 shows a fourth example of a signal under test waveform, in the form of a distorted square wave, and how this signal under test waveform can be histogram binned in accordance with an example embodiment.

FIG. 10 shows a fourth example of a signal under test waveform, in the form of a distorted square wave 1001, and how this signal under test waveform can be histogram binned 1002 in accordance with an example embodiment.

Now the histogram has been defined, the importance of each bin can be defined. This is determined by the number of samples in each bin, and can be either high (e.g., assigned a value of '1'), or low (e.g., assigned a value of '0'). Other values may also be used in some embodiments. In some embodiments, for a bin to have high importance assigned it has to satisfy either one of these two restrictions:

1) it comprises greater or equal to 30% of the total number of samples being analyzed (i.e., for repetitive signals, this is the number of samples in one cycle; for non-repetitive, this is the total number of samples held in the sample memory);

2) it comprises greater or equal to 10% of the total number of samples being analyzed, AND (i.e., the AND Boolean operator) is at least 4 times as large as the second smallest sample bin.

Finding the high importance bins can be described in 3 steps:

Step 1: For all bins, check if they are greater or equal to 30% of the total. If so, they are assigned high importance, else maybe not;

Step 2: Sort all the bins from small to large;

Step 3: Check for the 2 largest bins which are not high importance yet, and check if they are each greater than 10% of the total. If so, check if they are four times as large as the $2^{nd}$ smallest bin. If this is the case, they are to be assigned high importance, else not.

Now spikes can be found. It is also important to know the number of spikes per signal. According to an example embodiment, a signal can have 0, 1, 2 or 3 spikes. These spikes should be determined for each signal under test and the results should be saved for use in the below described decision process (see FIGS. 12a-c).

Before the decision process is described in more detail, there now follows a listing of different signal types that may be distinguished according to example embodiments of the present invention. The examples shown have ten different classes of signals, but other classes may be defined and therefore classified by the disclosed methods.

Signal Classes:

Embodiments of the invention provide methods and apparatuses to classify a signal under test, for example an input signal of a digital oscilloscope. The different signal classes that can be distinguished by the disclosed methods and apparatuses include, but are not limited to the following 10 classes, as shown in FIGS. 11a to 11j.

Figure 11A:
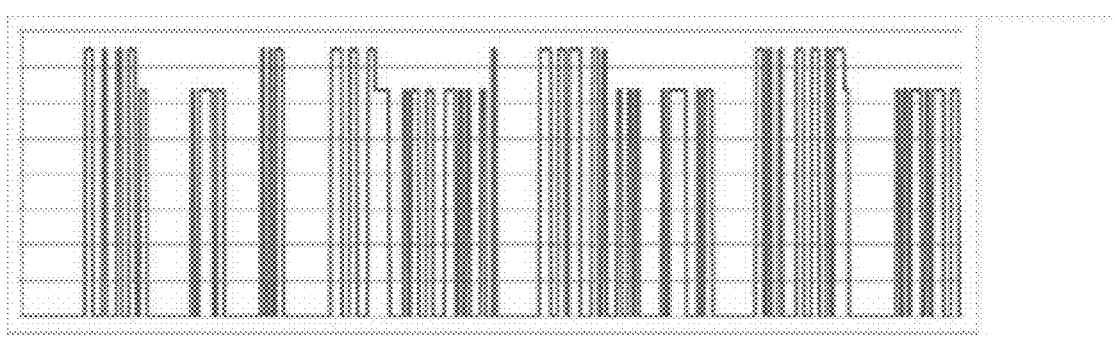
FIGS. 11a to 11j show examples of the different signal classes/types that may be distinguished according to example embodiments.

The first class comprises Bi-data signals, as shown in FIG. 11a. These signals are random binary sequences and are characterized by having only 2 values (on or off).

Figure 11B:
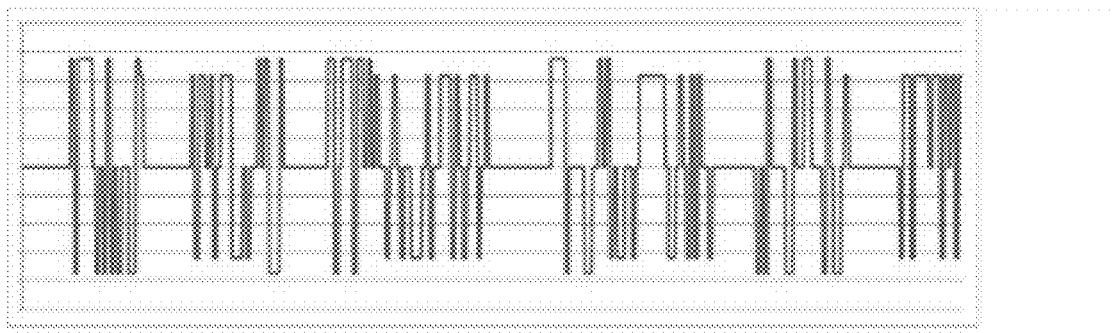

The second class comprises Tri-data signals, as shown in FIG. 11b. They are very alike Bi-data signals, but the only difference is that they can attain 3 different values.

Figure 11C:
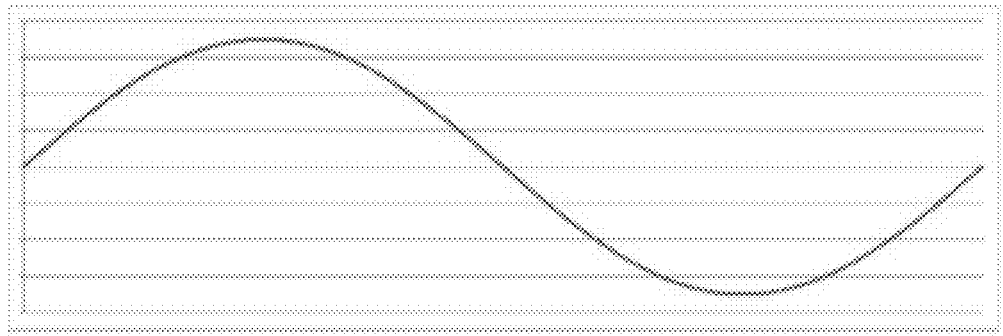

The third class comprises sine signals, and signals related to sine signals, as shown in FIG. 11c. Signals included in this class are: sines with spikes or flattened tops, absolute value sines, typical thyristor signals and typical inverter signals.

Figure 11D:

The fourth class comprises square signals, as shown in FIG. 11d. This signal class covers all square pulse like signals except for PWM signals and is characterized by (almost) vertical edges, with almost flat tops and bottoms.

Figure 11E:
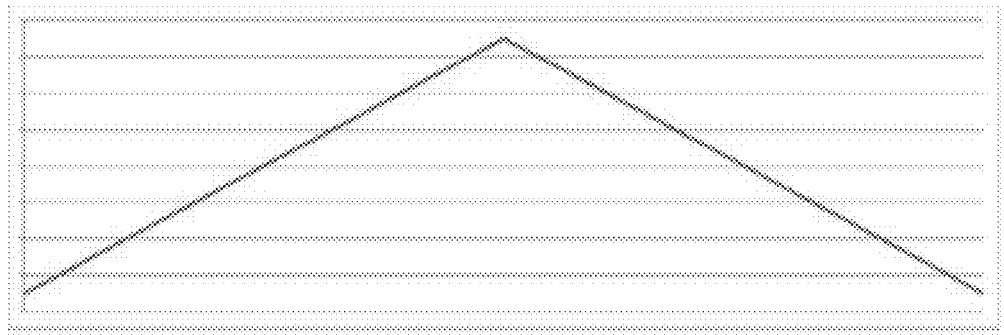

The fifth class comprises triangle signals, as shown in FIG. 11e. This signal class may be characterized by diagonal edges with almost no top or bottom.

Figure 11F:
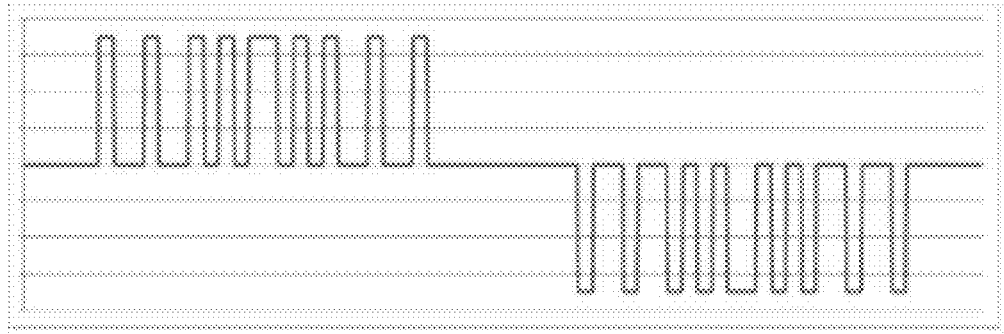

The sixth class comprises Pulse-width modulation (PWM) signals, for example as shown in FIG. 11f, and are often signals measured in motors, for example. Single sided PWM's are also included in this class.

Figure 11G:
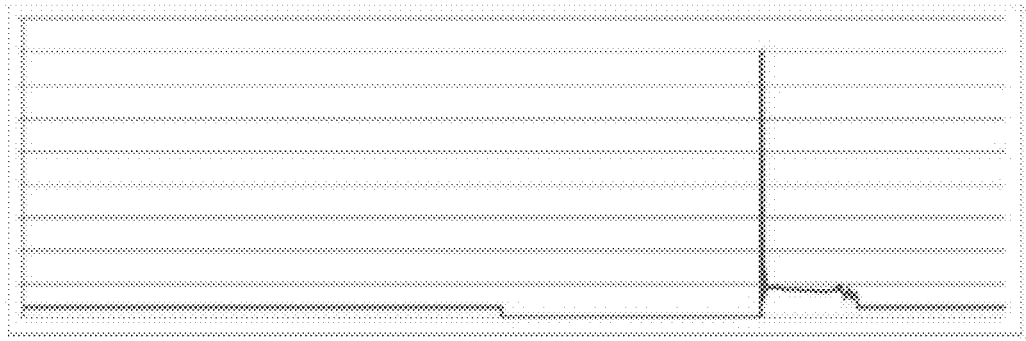

The seventh class comprises an ignition signal, as shown in FIG. 11g, which is a signal type that represents an ignition pulse and can be recognized by a single spike.

Figure 11H:
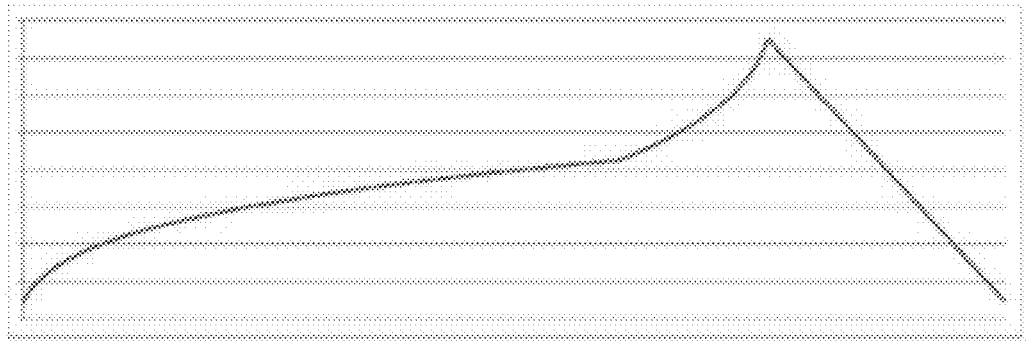

The eighth class comprises inductive pick-up signals, as shown in FIG. 11h, for example.

Figure 11I:

The ninth class comprises the fuel injector type signal, as shown in FIG. 11i, and is similar to the ignition signal class.

Figure 11J:
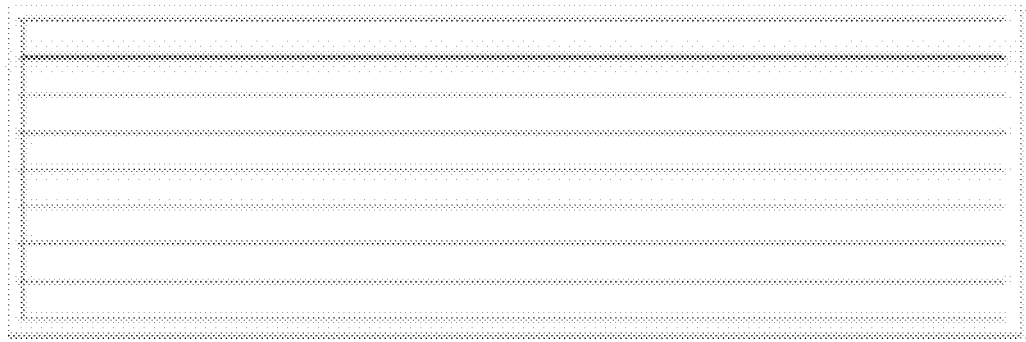

The tenth class comprises Direct Current (DC) signals, as shown in FIG. 11j, which is characterized by being a constant value (i.e., horizontal line).

In some other embodiments, other specific signal classes/types may be defined and used to classify an unknown input signal under test. For signals that do not match the above ten criteria, a default measurement may be made.

Decision Process

The signal classification decision process takes the output of all the above described (sub)tests on the signal(s) under test, and uses those results, suitably compared to reference values, where appropriate, in order to reach a decision on to which type or class of signal the signal under test belongs. The decision process may be carried out by suitably programmed computer hardware, such as that shown in FIG. 13, for example.

In brief overview, the exemplary decision process comprises nine sub-decisions, including but not necessarily limited to: whether the signal is repetitive or not; the number of important bins from the amplitude histogram; a determination of which bins are important out of the (five) possibilities; and then a further 6 sub-tests that are based on comparing bin values to predetermined thresholds derived, for example, from prior empirical analysis of known signal class types desirable for the disclosed methods to distinguish (as discussed below).

The first test splits the signal types into repetitive or non-repetitive types, using the frequency measurements which splits the whole potential set of signal classes into two groups. Then the amplitude histograms may be used to gain information about the values of the bins and the spikes then may be used to define certain signal classes types. Then the activity measurements together with the matched filter aspects may be used to detect some specific signal classes. This process may take the form of a logical decision tree, an iterative assessment process, using If-loops in Matlab, or any other suitable form of calculation.

Figure 12B:
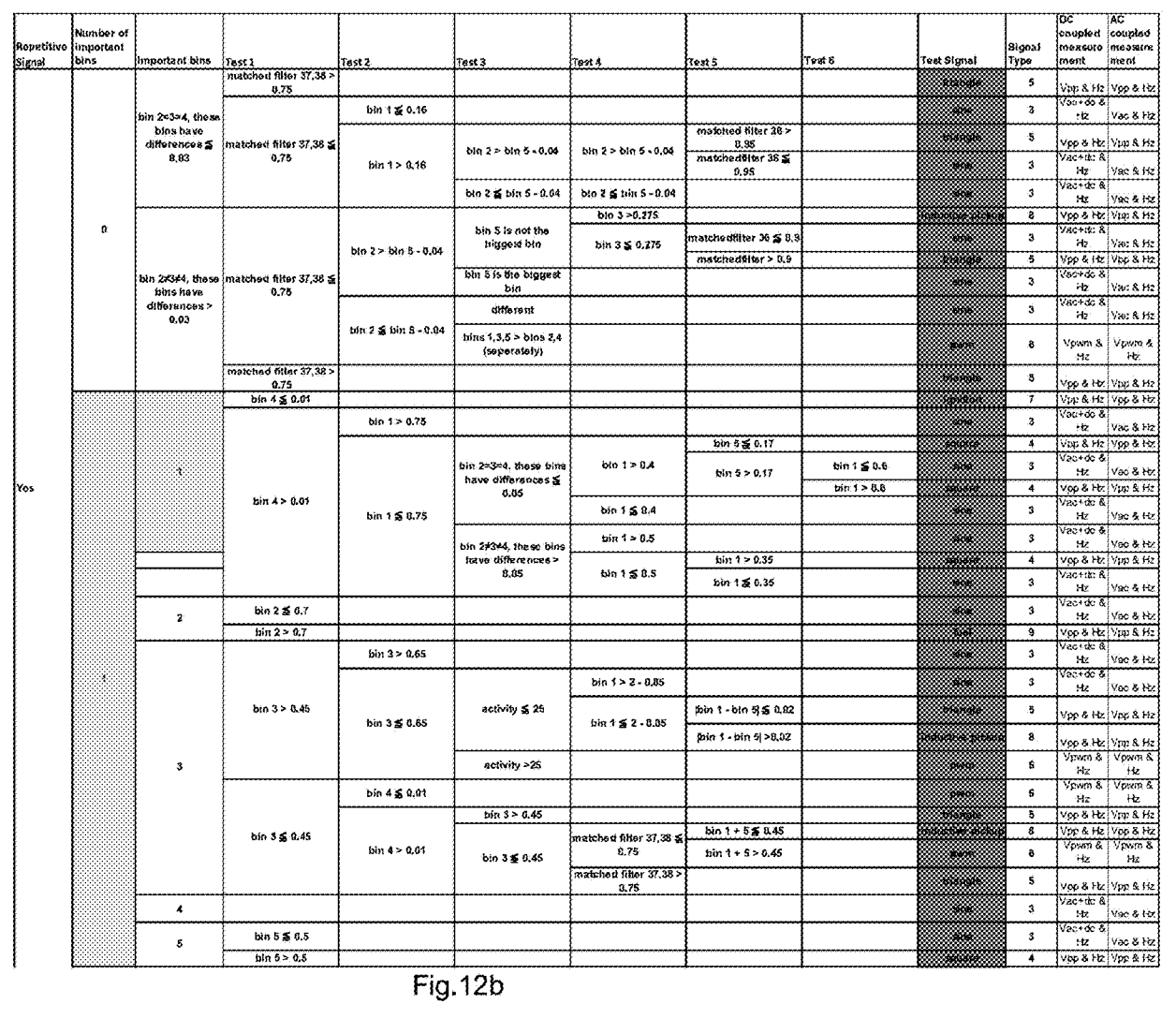

An example decision tree is show in FIGS. 12a to 12c, which is a single table implementation of an exemplary decision tree according to an embodiment of the present invention.

It starts at the top left and steps down and then to the right as each decision is made, for example whether a signal has a frequency or not. Generally, a '1' is displayed if the respective decision outcome is true and a '0' is displayed if the respective decision outcome is not true. The algorithm applied to the exemplary decision tree shown is arranged to proceed to the next decision column, if the result output of the last column is a '1'. This is to say the decision proceeds along until the first '0' in a row is seen thereby signaling the end of that decision outcome possibility being correct. Put another way, the decision tree acts as a form of "last man standing" outcome assessment, which is carried out in parallel until only a single outcome result is actually applicable. On the right hand side of FIG. 12, there are the results, which show the decided test signal type, and then the typical selection of suitable measurement(s)/parameter(s), for example, to be automatically applied to the display of the signal now that its type has been suitably detected/classified.

The whole decision tree may include over 90 decision steps, as shown in FIGS. 12a to 12c, and is capable of sorting out all different input signal examples into 10 classes, as defined below. In this decision tree, the word bin references a particular bin of the amplitude histogram.

Embodiments of the invention may be implemented in a number of different ways. One example is a computer program running on a computer system, said computer system comprising at least one processor, where the computer program includes executable code portions for execution by the said at least one processor, in order for the computer system to perform a method according to the described examples. The computer system may be a programmable apparatus, such as, but not limited to a dedicated digital test and measurement instrument, such as oscilloscope, or a more generic device carrying out the test and measurement processes, such as a personal computer, tablet or smartphone apparatus.

Determination of Values and Limits

Pure signals can easily be identified from their amplitude histograms. However, the more they deviate from being pure the more difficult it becomes to identify them. Take the example of a pure (FIG. 9) and distorted (FIG. 10) square wave, their amplitude histograms look very different, and if we consider what a half wave rectified signal (FIG. 8) looks like, then the distorted square looks more like this than the pure square.

This has resulted in the generation of multiple tests to not only identify pure signals but also the distorted variants and these tests employ amplitude histograms, matched filter testing and activity testing. Basically the more the signal differs from a pure form, the more tests are required to differentiate it from other potential distorted signals. These tests have been developed by simulation of pure signals and their distorted variants and then defining tests using amplitude histograms, matched filter testing and activity to differentiate between the various signals.

Some examples will now be explained, from which the general principles maybe elucidated and applied to any other signal type.

Waveform Characterization Example for Pure Square (FIG. 9) and Distorted (FIG. 10) Square Waves.

These are both repetitive signals where the frequency can be measured. Performing an amplitude histogram on these signals result in the following results:

Pure Square—There is shown in FIG. 9 a pure square wave with 50% duty cycle and sharp edges. Bin 1 and Bin 5 are each greater than 0.3 of the total, and are therefore important. Working through the decision table of FIGS. 12a to 12c (from left to right), we have a repetitive signal, with 2 important buckets at 1 and 5. This results in testing of bucket 3 to see if it is equal to 0, which it is. This results in the testing of (bucket 1+bucket 2−0.5)<=0.06 which it is. This, in turn, results in the testing of the activity factor, which if >25, then the signal is a PWM signal, whereas if <25, it is a square form. In this case it is less than 25, and thus the signal is a square, and the measurements of peak-to-peak voltage (Vpp) and frequency (Hz) are selected.

Distorted Square—This is shown in FIG. 10, and is based on a square wave with a 25% duty cycle and slow edges. The majority of the samples now fall in Bin 1 (signal low) with the next largest being Bin 5 (signal high). As the edges are slow samples, samples also fall in Bins 2, 3, and 4. Only Bin 1 is greater than 0.3 of the total and therefore important. Working through the decision table of FIGS. 12a to 12c (from left to right), we have a repetitive signal, with 1 important bucket at Bin 1. This results in the testing of bucket 4 to see if is >0.01, which it is. Then Bin 1 is tested to see if it >0.75, which it is not. Then the variation between Bins 2, 3, and 4 are tested to see if they are <=0.05, which they are. The size of Bin 4 is then tested to see if it is >0.4 which it is not. The size of Bin 5 is then tested to see if it greater than 0.17 which it is not. This results in waveform being identified as a square.

FIGS. 12a to 12c detail all respective decisions that lead to each final signal classification decision, using parameters and limits/values derived from empirical study of numerous example singles, both pure, and distorted.

Figure 13:
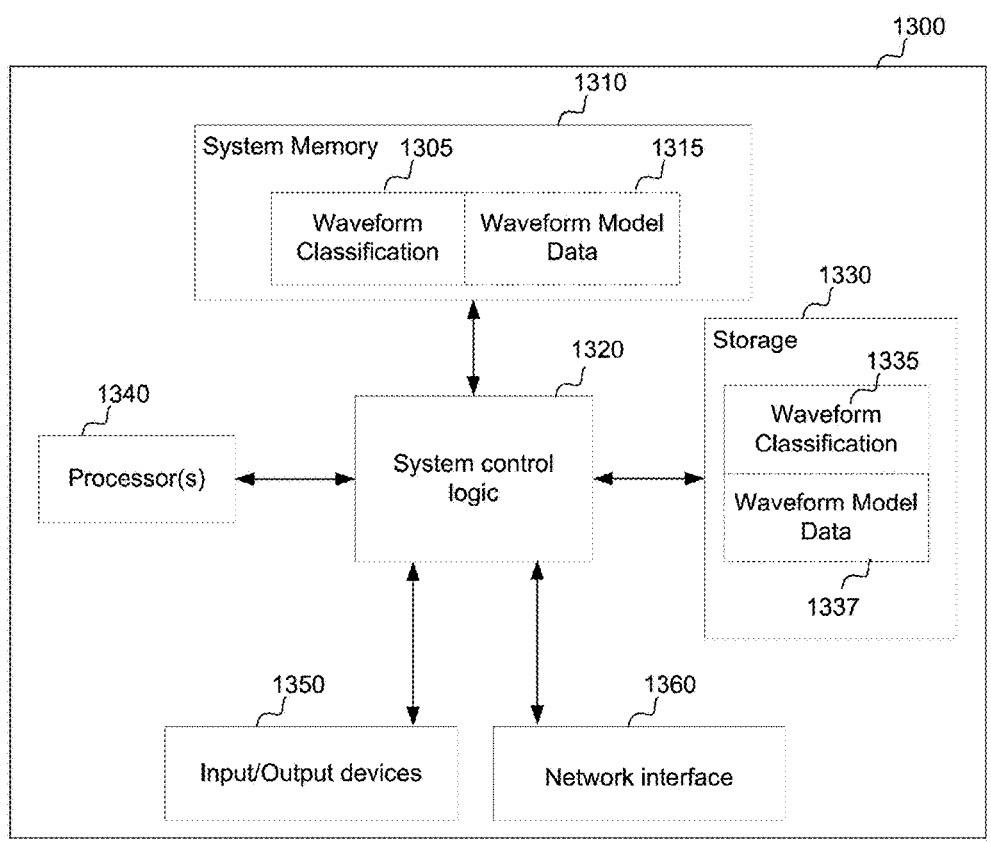
FIG. 13 shows an example implementation of a test and measurement apparatus for classifying a signal in accordance with an example embodiment.

FIG. 13 shoes an exemplary generic embodiment of such a computer system 1300, which may form the system/CPU 150 of FIG. 1, and/or acquisition logic circuit 160, either of which may be the entity that carries out the disclosed methods of classifying a signal under test in a test and measurement instrument.

The computer system 1300 comprises one or more processor(s) 1340, system control logic 1320 coupled with at least one of the processor(s) 1340, system memory 1310 coupled with system control logic 1320, non-volatile memory (NVM)/storage 1330 coupled with system control logic 1320, and a network interface 1360 coupled with system control logic 1320. The system control logic 1320 may also be coupled to Input/Output devices 1350.

Processor(s) 1340 may include one or more single-core or multi-core processors. Processor(s) 1340 may include any combination of general-purpose processors and dedicated processors (e.g., graphics processors, application processors, etc.). Processors 1340 may be operable to carry out the above described methods, using suitable (e.g., non-transitory) instructions or programs (i.e., operate via use of processor, or other logic, instructions). The instructions may be stored in system memory 1310, as waveform classification process (or module) 1305, or additionally or alternatively may be stored in non-volatile memory (NVM)/storage 1330, as NVM waveform classification process/module portion 1335, to thereby instruct the one or more processors 1340 to carry out the waveform classification methods described herein. The system memory 1310 may also include waveform model data 1315, whilst NVM storage 1330 may include waveform model data 1337. These may serve to waveform models or other data used in the disclosed waveform classification methods, including but not limited to decision tree data, decision values, and the like.

System control logic 1320 for one embodiment may include any suitable interface controllers to provide for any suitable interface to at least one of the processor(s) 1340 and/or to any suitable device or component in communication with system control logic 1320. System control logic 1320 for one embodiment may include one or more memory controller(s) (not shown) to provide an interface to system memory 1310. System memory 1310 may be used to load and store data and/or instructions, for example, for system 1300. System memory 1310 for one embodiment may include any suitable volatile memory, such as suitable dynamic random access memory (DRAM), for example.

NVM/storage 1330 may include one or more tangible, non-transitory computer-readable media used to store data and/or instructions, for example. NVM/storage 1330 may include any suitable non-volatile memory, such as flash memory, for example, and/or may include any suitable non-volatile storage device(s), such as one or more hard disk drive(s) (HDD(s)), one or more compact disk (CD) drive(s), and/or one or more digital versatile disk (DVD) drive(s), for example. The NVM/storage 1330 may include a storage resource physically part of a device on which the system 1300 is installed or it may be accessible by, but not necessarily a part of, the device. For example, the NVM/storage 1330 may be accessed over a network via the network interface 1360. System memory 1310 and NVM/storage 1330 may respectively include, in particular, temporal and persistent copies of, for example, the instructions memory portions holding the waveform classification process/module/application 1305 and 1335, respectively.

Network interface 1360 may provide a radio interface for system 1300 to communicate over one or more network(s) (e.g., wireless communication network) and/or with any other suitable device.

A computer program may be formed of a list or collection of executable instructions such as a particular application program and/or an operating system. The computer program may for example include one or more of: a subroutine, a function, a procedure, an object method, an object implementation, an executable application ("app"), an applet, a servlet, a source code portion, an object code portion, a shared library/dynamic load library and/or any other sequence of instructions designed for execution on a suitable computer system.

The computer program may be stored internally on a computer readable storage medium or transmitted to the computer system via a computer readable transmission medium. All or some of the computer program may be provided on computer readable media permanently, removably or remotely coupled to the programmable apparatus, such as an information processing system. The computer readable media may include, for example and without limitation, any one or more of the following: magnetic storage media including disk and tape storage media; optical storage media such as compact disk media (e.g., CD ROM, CD R, Blu-ray, etc.) digital video disk storage media (DVD, DVD-R, DVD-RW, etc.) or high density optical media (e.g., Blu-ray, etc.); non-volatile memory storage media including semiconductor-based memory units such as FLASH memory, EEPROM, EPROM, ROM; ferromagnetic digital memories; MRAM; volatile storage media including registers, buffers or caches, main memory, RAM, DRAM, DDR RAM, etc.; and data transmission media including computer networks, point-to-point telecommunication equipment, and carrier wave transmission media, and the like. Embodiments of the invention may include tangible and non-tangible embodiments, transitory and non-transitory embodiments and are not limited to any specific form of computer readable media used.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may be implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

Examples provide a method of classifying a signal waveform under test for appropriate numerical measurement, comprising acquiring waveform data indicative of the signal waveform under test, analyzing the waveform data, determining a signal waveform type from the analyzed waveform data, and, optionally, activating an appropriate numerical measurement of the signal waveform under test based upon the determined signal waveform type.

In some examples, acquiring waveform data indicative of the signal waveform under test comprises acquiring the waveform data using a test and measurement instrument.

In some examples, acquiring the waveform data comprises storing waveform data values for at least one complete cycle of the signal under test and a value indicative of a next trigger.

In some examples, the value indicative of the next trigger is an approximate repetition rate of the signal waveform under test. In some examples, a lack of a value indicative of the next trigger is indicative of the signal waveform under test being a non-repetitive signal.

In some examples, acquiring the waveform data further comprises automatically scaling an amplitude of the acquired waveform data and/or applying automatic timebase control to ensure acquisition of the waveform data for at least one cycle of the signal waveform under test.

In some examples, applying automatic timebase control further comprises determining a lowest repetitive frequency of the signal waveform under test, to thereby determine a single cycle length of the signal waveform under test.

In some examples, analyzing the waveform data comprises determining if the signal waveform under test is a repetitive signal having at least two repeating cycles and/or determining if the signal waveform under test is a non-repetitive signal (e.g., a random stream).

In some examples, determining if the signal waveform under test is a repetitive signal comprises measuring an exact repetition rate of the signal waveform under test using a frequency counter function of a test and measurement instrument.

In some examples, the method further comprises determining a number of samples in a single cycle of a repetitive signal waveform under test. In some examples, the number of samples is a number of digital samples acquired or captured by a digital test and measurement instrument. In some examples, the method further comprises filtering the waveform data to remove unwanted noise.

In some examples, the filtering of the waveform data comprises filtering samples of the signal waveform under test using a moving average with a step function filter.

In some examples, the moving average with a step function filter uses a step value limit of 20% of total amplitude to define a step to be ignored in the filtering; and/or, wherein the moving average with a step function filter averages over at least a last five samples and a previous five samples.

In some examples, the method further comprises determining an amplitude histogram of: a single cycle if the signal waveform under test is a repetitive signal or a complete acquisition memory of a test and measurement instrument if the signal waveform under test is a non-repetitive signal. In some examples, the amplitude histogram is a five bin amplitude histogram.

In some examples, determining an amplitude histogram further comprises determining an importance of each bin in the histogram, wherein the importance of each bin comprises a value of 1 or 0 and allocation of a value 1 occurs if either a bin under importance assessment is greater or equal to 30% of the total number of samples, or the bin under importance assessment is greater or equal to 10% of the total number of samples and is at least four times as large as a second smallest sample bin out of all the samples from the signal waveform under test.

In some examples, the method further comprises performing data activity analysis, wherein performing data activity analysis comprises determining an amount of signal variation in at least a single cycle of the signal waveform under test. In some examples, the amount of signal variation defining high activity comprises greater or equal to 30% of the total amplitude of the signal waveform under test.

In some examples, the method further comprises matched filter testing of the signal waveform under test, wherein matched filter testing comprises comparing a portion, optionally at least a single cycle, of the signal waveform under test against a template of a known signal type.

In some examples, the matched filter is defined by the equation:

$$\text{matched filter} = \frac{x \cdot u^T}{\|x\|\|u\|},$$

wherein, x is a vector of the measured samples, u is the template vector, in the numerator the inner product is used, uT is the transpose of u and a 2-norm function is used in the denominator, wherein a value of 1 indicates a positive similarity, and a value of −1 indicates a negative similarity. In some examples, matched filter testing determines a type of triangle waveform class.

In some examples, determining the signal waveform type from the analyzed waveform data comprises using a decision tree to select an appropriate candidate signal class from a plurality of potential signal classes.

In some examples, the plurality of potential signal classes includes any one or more of: bi-data signals; tri-data signals; sine wave based signals; square wave signals; triangle signals; Pulse Width Modulated (PWM) signals; ignition signals; inductive signals; fuel injector signals; and Direct Current (DC) signals.

In some examples, determining the signal waveform type from the analysed waveform data comprises determining if the signal is repetitive, determining a number of important bins in an amplitude histogram, determining a relative importance of bins of the amplitude histogram and selecting a type of signal class based upon the determinations.

In some examples, the method further comprises selecting numerical measurements to be carried out on the signal waveform under test dependent upon the determined signal waveform type of the signal waveform under test. In some examples, a parameter of a test and measurement instrument is adjusted by the test and measurement instrument dependent upon the determined signal waveform type of the signal waveform under test.

Examples also provide a test and measurement apparatus configured to carry out any of the (whole of or portions of the) described methods. Examples also provide a (non-transitory) computer readable medium comprising instructions, which, when executed by one or more processors, results in the one or more processors carrying out any of the described methods. This, may, for example, take the form of an upgrade module or memory device having a software-based upgrade thereon, for use in/application to an existing test and measurement instrument.

Whilst the described examples are methods of classifying a signal in the broadest sense, the described methods may be particularly applicable in the test and measurement field, in order to classify an unknown input signal type, input a test and measurement instrument, so that the test and measurement embodying the invention may automatically configured itself to carry out the most and/or a more appropriate test regimen on the input signal. This may include altering the test type, altering test input/output parameters, altering the test reporting approach or style, or the like. Accordingly, example embodiments may provide an improved test and measurement instrument man-machine interface, such that a user of the so equipped test and measurement instrument does not need to be so highly trained. This may lead to improved usability, and the like.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The mere fact that certain measures are recited in mutually different claims does not indicate that a combination of these measures cannot be used to advantage. Unless otherwise stated as incompatible, or the physics or otherwise of the embodiments prevent such a combination, the features of the following claims may be integrated together in any suitable and beneficial arrangement. This is to say that the combination of features is not limited by the claim forms, particularly the form of the dependent claims.

The invention claimed is:

1. A method of classifying a signal waveform under test for appropriate numerical measurement, comprising:
   acquiring waveform data indicative of the signal waveform under test;
   analyzing the waveform data;
   determining a signal waveform type from the analyzed waveform data; and
   activating an appropriate numerical measurement of the signal waveform under test based upon the determined signal waveform type,
   wherein determining the signal waveform type from the analyzed waveform data includes:
      determining if the signal is repetitive;
      determining a number of important bins in an amplitude histogram;
      determining a relative importance of bins of the amplitude histogram; and
      selecting a type of signal class based upon the determinations, and
   wherein, for the signal waveform to be classified as at least one type of signal class, the method further comprises performing either or both a data activity analysis in which an amount of signal variation in at least a single cycle of the signal waveform under test is compared to a threshold, and/or a matched filter test in which a portion of the signal waveform under test is compared against a template of a known signal type.

2. The method according to claim 1, wherein acquiring the waveform data comprises storing waveform data values for at least one complete cycle of the signal under test and a value indicative of a next trigger.

3. The method according to claim 2, wherein the value indicative of the next trigger is an approximate repetition rate of the signal waveform under test or a lack of a value indicative of the next trigger is indicative of the signal waveform under test being a non-repetitive signal.

4. The method according to claim 2, wherein acquiring the waveform data further comprises automatically scaling an amplitude of the acquired waveform data and/or applying automatic timebase control to ensure acquisition of the waveform data for at least one cycle of the signal waveform under test.

5. The method according to claim 1, wherein analyzing the waveform data comprises determining if the signal waveform under test is a repetitive signal having at least two repeating cycles and/or determining if the signal waveform under test is a non-repetitive signal.

6. The method according to claim 1, wherein the method further comprises determining a number of samples in a single cycle of a repetitive signal waveform under test.

7. The method according to claim 1, further comprising filtering the waveform data to remove unwanted noise, optionally wherein the filtering of the waveform data comprises filtering samples of the signal waveform under test using a moving average with a step function filter.

8. The method according to claim 5, further comprising determining an amplitude histogram of: a single cycle if the signal waveform under test is a repetitive signal or a predetermined memory size limit of a test and measurement instrument if the signal waveform under test is a non-repetitive signal.

9. The method according to claim 8, wherein determining an amplitude histogram further comprises determining an importance of each bin in the histogram, wherein the importance of each bin comprises a value of 1 or 0 and allocation of a value 1 occurs if either:
   a bin under importance assessment is greater or equal to 30% of the total number of samples; or
   the bin under importance assessment is greater or equal to 10% of the total number of samples and is at least four times as large as a second smallest sample bin out of all the samples from the signal waveform under test.

10. The method according to claim 1, wherein the data activity analysis includes calculating and comparing sample-to-sample amplitude differences in the waveform data against an activity limit derived from a peak-to-peak amplitude of the waveform data.

11. The method according to claim 1, wherein the matched filter testing includes processing a vector of measured samples in the waveform data with a template vector to produce a value indicative of a degree of similarity between the signal waveform and the template.

12. The method according to claim 11, wherein the matched filter testing uses a matched filter defined by the equation $$\text{matched filter} = \frac{x \cdot u^T}{\|x\|\|u\|},$$

wherein x is a vector of the measured samples, u is the template vector, in the numerator the inner product is used, $u^T$ is the transpose of u and a 2-norm function is used in the denominator, wherein a value of 1 indicates a positive similarity, and a value of −1 indicates a negative similarity.

13. The method according to claim 1, wherein the method further comprises selecting numerical measurements to be carried out on the signal waveform under test dependent upon the determined signal waveform type of the signal waveform under test.

14. A test and measurement apparatus configured to carry out the method of claim 1.

15. A method of classifying a signal waveform under test for appropriate numerical measurement, comprising:
   acquiring waveform data indicative of the signal waveform under test;
   analyzing the waveform data;
   determining a signal waveform type from the analyzed waveform data; and
   activating an appropriate numerical measurement of the signal waveform under test based upon the determined signal waveform type,
   wherein acquiring the waveform data comprises storing waveform data values for at least one complete cycle of the signal under test and a value indicative of a next trigger, and
   wherein the value indicative of the next trigger is an approximate repetition rate of the signal waveform under test or a lack of a value indicative of the next trigger is indicative of the signal waveform under test being a non-repetitive signal.

16. A method of classifying a signal waveform under test for appropriate numerical measurement, comprising:

acquiring waveform data indicative of the signal waveform under test;
analyzing the waveform data;
determining a signal waveform type from the analyzed waveform data; and
activating an appropriate numerical measurement of the signal waveform under test based upon the determined signal waveform type,
the method further comprising matched filter testing of the signal waveform under test, wherein matched filter testing comprises comparing a portion, optionally at least a single cycle, of the signal waveform under test against a template of a known signal type, and
wherein the matched filter testing uses a matched filter defined by the equation $$\text{matched filter} = \frac{x \cdot u^T}{\|x\|\|u\|},$$

wherein x is a vector of the measured samples, u is the template vector, in the numerator the inner product is used, $u^T$ is the transpose of u and a 2-norm function is used in the denominator, wherein a value of 1 indicates a positive similarity, and a value of −1 indicates a negative similarity.

* * * * *